(12) United States Patent
Heath et al.

(10) Patent No.: US 6,365,319 B1
(45) Date of Patent: Apr. 2, 2002

(54) SELF-CONTAINED IMAGING MEDIA COMPRISING OPAQUE LAMINATED SUPPORT

(75) Inventors: Terry A. Heath, Caledonia; Yongcai Wang, Webster; Charles C. Anderson, Penfield, all of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/557,027

(22) Filed: Apr. 20, 2000

(51) Int. Cl.[7] .............. G03C 1/72; G03C 1/76; G03C 1/77; G03C 1/795; G03C 1/95

(52) U.S. Cl. ............ 430/138; 430/272.1; 430/275.1; 430/276.1; 430/278.1; 430/293; 430/273.1

(58) Field of Search .............. 430/138, 272.1, 430/273.1, 275.1, 276.1, 278.1, 293

(56) References Cited

U.S. PATENT DOCUMENTS

| | | | |
|---|---|---|---|
| 4,399,209 A | 8/1983 | Sanders et al. | 430/138 |
| 4,416,966 A | 11/1983 | Sanders et al. | 430/138 |
| 4,440,846 A | 4/1984 | Sanders et al. | 430/138 |
| 4,648,699 A | 3/1987 | Holycross et al. | 354/297 |
| 4,740,809 A | 4/1988 | Yamamoto et al. | 355/27 |
| 4,766,050 A | 8/1988 | Jerry | 430/138 |
| 4,971,941 A | * 11/1990 | Dowler et al. | 503/204 |
| 4,992,822 A | 2/1991 | Yamamoto et al. | 355/27 |
| 5,698,489 A | * 12/1997 | Shirai et al. | 503/227 |
| 5,783,353 A | 7/1998 | Camillus et al. | 430/138 |
| 5,893,662 A | 4/1999 | Ito | 399/110 |
| 5,916,727 A | 6/1999 | Camillus et al. | 430/138 |
| 5,996,793 A | 12/1999 | Uchibori et al. | 430/138 |
| 6,033,786 A | 3/2000 | Fatica et al. | 428/461 |

FOREIGN PATENT DOCUMENTS

JP    1-136783    * 5/1989

OTHER PUBLICATIONS

Derwent Abstract 1989–197675—English Abstract for JP 1–136783 Published on May 30, 1989.*

* cited by examiner

Primary Examiner—Janet Baxter
Assistant Examiner—Sin J. Lee
(74) Attorney, Agent, or Firm—Chris P. Konkol

(57) ABSTRACT

A self-contained photohardenable imaging assembly comprising in order: a first transparent support; an imaging layer comprising a developer material and a plurality of photohardenable microcapsules encapsulating a color precursor, and a second opaque support, wherein the opaque support comprises a barrier layer that exhibits a low water vapor transmission rate, which barrier layer comprises a metallic material. The imaging assembly has been found to provide better image quality and more consistence sensitometric response to pressure development.

25 Claims, 5 Drawing Sheets

SELF-CONTAINED IMAGING MEDIA COMPRISING OPAQUE LAMINATED SUPPORT

FIELD OF THE INVENTION

The present invention relates to an imaging assembly that comprises photohardenable microcapsules containing coloring agents. Development is accomplished by the application of uniform pressure to the imaging assembly. In particular, the imaging assembly comprises an opaque support having a preselected vapor transmission rate in combination with optical properties that provide for improved image quality and performance.

BACKGROUND OF THE INVENTION

The present invention relates to an imaging medium in the form of a self-contained imaging assembly and, more particularly, to an improved self-contained imaging assembly containing a photosensitive imaging layer or layers comprising photohardenable microcapsules encapsulating a coloring material and, outside the microcapsules, a developer material disposed between a first transparent support and a second support which may be opaque or transparent. The imaging medium or assembly can also be referred to as a recording medium, and the imaging layer can be referred to as a recording layer, since the assembly can serve both to capture an image (either the original image or an electronic copy), as does film, and also to display the image, as does a print. Consistent with this fact, the imaging assembly can form a positive image.

The photosensitive imaging layer (including microcapsules) is colored by pressure development after exposure to radiation based on image information. The microcapsules, whose mechanical strength changes (increases) when exposed to light, are ruptured by means of pressure development, whereupon the coloring material and other substances encapsulated in the microcapsules flow out (to varying amounts based on the exposure) and development occurs. The coloring material, such as a substantially colorless color former, migrates to, and reacts with, the developer material and coloring occurs, whereupon a color image is developed.

The "rupture" of the microcapsules are not an all-or-nothing event. Rather, the microcapsules exposed to light are differentially photocured to release varying amounts of color former in order to achieve tonal depth in the exposed area. The differential exposure to light proportionately increases the viscosity of the photocurable composition and thus immobilizes the color former proportionately to the desired tonal depth in the exposed area. The rupture of the microcapsules and the release of the color former is accomplished by the uniform application of pressure. Development of the photosensitive imaging layer can be accomplished, for example, by passing the imaging assembly between a pair of upper and lower nip rollers.

Photohardenable imaging systems employing microencapsulated photosensitive compositions are the subject of various patents, including U.S. Pat. Nos. 4,399,209, 4,416, 966, 4,440,846, 4,766,050, 5,783,353, and 5,916,727. Image forming devices (also referred to as printers) are disclosed, for example, in U.S. Pat. No. 4,740,809, wherein exposure occurs by guiding a light from a light source for a plurality of colors across a photosensitive recording medium. U.S. Pat. No. 4,992,822 discloses an image forming device, capable of producing a plurality of colors via a polygonal mirror, for repeatedly exposing the same pixels in a photosensitive recording medium. U.S. Pat. No. 5,893,662 discloses a device for printing an image wherein the device can be incorporated into a computer bay. U.S. Pat. No. 4,648,699 describes a development technique which employs, instead of a pair of nip rollers, a point contact ball moving relative to the photosensitive recording medium.

In the most typical embodiments, the photohardenable composition is a photopolymerizable composition including a polyethylenically unsaturated compound and a photoinitiator and is encapsulated together with a color former. Exposure to actinic radiation hardens the internal phase of the microcapsules. Then, as mentioned above, following exposure, the imaging media in the form of a sheet can be subjected to a uniform rupturing force by passing the sheet through the nip between a pair of pressure rollers.

One of the problems in providing a self-contained imaging assembly that provides a high quality print is image stability or "keeping" which is affected by humidity sensitivity. It is known that print quality, and in particular sensitometric response to actinic radiation, can be significantly affected by sensitivity to humidity and the relative humidity of the environment. Even if the media is manufactured and packaged at a particular humidity, which is found optimum for print quality, variations after the media acclimates to a different later environment can adversely affect the sensitometric properties. This has been believed due to the materials employed in the imaging media, in particular the degree of hardening or curing of the internal phase of a microcapsule and the consequent increase in the viscosity varying with a change in humidity. As a result thereof, photographic characteristics such as speed, maximum density and fogging density are changed from the original optimum. Furthermore, a full color imaging is adversely affected.

In forming a full color image, color precursors which develop into yellow, magenta and cyan colors and photoinitiators corresponding to blue, green and red lights are encapsulated in an internal phase of the microcapsules, and the three sets of the microcapsules are mixed to prepare a full color imaging material containing a developer. The photographic characteristics of the respective microcapsules vary with a change in humidity to different degrees, resulting in muddy colors or incorrect or suboptimal colors. For example, when it is desired that a yellow color be developed, cyan and magenta capsules are cured by red and green lights, and only a yellow color former reacts with a color-developer to form an image. However, if the cyan or magenta capsules insufficiently cure due to a change in humidity, the result may be a muddy color in which cyan or magenta is blended with yellow to some extent. Such muddy colors or other sensitometric phenomena due to a change in humidity has been a significant problem.

One technique that has been used to address the humidity problem and to improve media stability resides is conditioning the layer containing the developer and microcapsules to a relative humidity (RH) of about 10 to 40% and preferably about 20%. For example, U.S. Pat. Nos. 5,916,727 and 5,783,353 disclose conditioning the layer at about 20% RH for about 2 to 12 hours or more, at ambient temperatures, and subsequently sealing the assembly at this low RH level to assure that the layer is relatively moisture-free during the normal shelf-life of the assembly.

U.S. Pat. No. 5,996,793 discloses storing the image-forming material together with a humidity-controlling material. Further, the patent discloses storing the image-forming material and the humidity-controlling material within a package made from a low-moisture permeable film. The low-moisture permeable film can be a plastic film on which is deposited a metal. Other low-moisture permeable films mentioned include fluorinated resins such as polytetrachloroethylene, polytrifluoroethylene, chlorinated rubber, polyvinylidene chloride, a copolymer of polyvinylidene chloride and acrylonitrile, polyethylene, polypropylene, polyesters, and films obtained by depositing a metal such as aluminum and a metal oxide such as silicon oxide.

Unfortunately, when the imaging media are not used right away, especially if a plurality of media are stored for some time in a printing device prior to forming an image, the media may have an opportunity to adjust to ambient humidity and, especially in very dry or very humid climates, the RH of the media may decrease or increase substantially in a short time. Once the imaging media is removed from a package, it does not take very long for the environmental humidity to affect the media. Ambient humidity can soon penetrate the outside surface support on each side of the media cause a change in the moisture content within the media.

U.S. Pat. No. 5,783,353 teaches that commercially available materials may be used for the opaque support in media comprising light-sensitive, pressure rupturable microcapsules. Materials listed include paper, cardboard, polyethylene, and polyethylene-coated paper. Opaque films are typically composites or admixtures of the polymer and the pigment in a single layer. U.S. Pat. No. 5,783,353 states that, alternatively, an opacifying agent can be provided in a separate layer underlying or overlying a polymer film such as PET. The patent further states that the opaque support should be sufficiently opaque so that when an imaging medium is exposed to radiation through the transparent support, the opaque support is effective to prevent the radiation from penetrating to other imaging media which may be stacked behind the imaging medium during the exposure step. The patent states, however, that if the units are not exposed in a stacked format, the opacity of the support is not critical so long as the support provides the desired background.

Metal barriers have been used in other contexts, in the photographic and packaging arts. In the packaging art, excellent oxygen and moisture barrier properties are desired or required. One approach to improving the oxygen and moisture vapor transmission of polymer films in the packaging art, in particular, is the application of a barrier coating in the form of a metal coating to the surface of a packaging film, to thereby form a metallized film.

U.S. Pat. No. 6,033,786 teaches a biaxially oriented, heat-set, multilayer film, including a core layer, a bonding layer having a surface adhered to the core layer, and a flame treated surface opposite the surface adhered to the core layer. A metal coating for providing oxygen and moisture barrier properties is deposited on the flame treated surface and a protective plastic film adhered to the metal coating. The core layer and bonding layer either are free of void-creating additives or include only a quantity of such additives that does not create a matte surface adversely affecting the barrier properties of the metal coating. The bonding layer comprising a mixture including 40 to 100% by weight of propylene/butene-1 copolymer containing up to about 14% by weight of butene-1, 0 to 60% of an isotactic polypropylene, and 0 to 50% of a copolymer of ethylene and propylene wherein propylene is the predominant component by weight.

Numerous patents disclose various methods of coating a polymer film with a metal. For example, Japanese Pat. Publication No. 61-225049 teaches preparation of metallized polypropylene films by extruding a mixture of polypropylene and a hydrocarbon resin and treating the surface thereof with corona discharge in a nitrogen/$CO_2$ atmosphere. This treatment inserts amino and/or amido groups into the surface of the film to a depth of about 100 Angstroms. The thus treated film surface is then metallized. U.S. Pat. No. 4,888,237 discloses a metallized film in which the surface that is provided with a metallized coating is the surface of a crystalline polyolefin layer that is flame treated prior to being metallized. U.S. Pat. No. 4,487,871, issued to Ishibashi, et al., discloses a polyolefin resin composition including a propylenebutene-1 copolymer having a propylene component in a weight percent of at least 70%. This copolymer is present in the range of 96%–80% by weight, and the composition additionally includes 4% to 20% by weight of a high density polyethylene homopolymer or copolymers of ethylene as a main component with other alpha-olefins. U.S. Pat. No. 4,487,871 discloses corona treating a surface of the composition to be provided with a metal coating.

After extensive investigation, Applicants have found that humidity affects the mechanical properties of the imaging layer in a self-contained imaging assembly comprising photohardenable microcapsulated coloring agents, as compared to affecting the reaction properties of materials during photohardening of the imaging layer. This effect on mechanical properties causes undesirable variations in the degree of rupture of the microcapsules when the media is subjected to pressure during development. Although not wishing to be bound by theory, this may be due to the humidity changing the break strength of the capsules and/or it may be due to the change in pressure applied on the capsules due to the change in the stiffness of the image layer which in turn increases the stress applied to the microcapsules, more likely the latter.

An object of the present invention is, therefore, to provide a self-contained photohardenable imaging assembly that is resistant to the affect of humidity and which will print consistently in response to a means for applying pressure to the assembly.

Another object of the present invention is to provide a self-contained photohardenable imaging assembly that provides better image quality by producing greater whiteness, opacity and reflectance.

Still another object of the present invention is to obtain an improved media that has no significant change in sensitometric properties with relative humidity, based on speed, Dmax, Dmin, tonal scale, and full color correctness.

Still another object is to obtain an improved media that has improved Raw Stock Keeping (RSK), from manufacture to use.

It would be particularly desirable if these objectives could be accomplished without requiring radical changes in conventional imaging chemistry, with respect to the microcapsules and the developer. It would be advantageous if these objectives could be attained in a product that was economical to manufacture and inexpensive for the customer to purchase.

SUMMARY OF THE INVENTION

In the self-contained imaging assembly of the present invention, an imaging layer containing developer and photohardenable microcapsules is placed between two support members to form an integral unit, wherein one support is transparent and one support is opaque, comprises a metallic barrier layer, and exhibits a water vapor transmission rate of less than 0.77 g/m$^2$/day (0.05 g/100 in$^2$/day). The opaque support also has very high opacity and reflectance at the interface with the imaging layer. Preferably, the imaging assembly is also sealed on the sides to further prevent water vapor from permeating out of the imaging layer. The term "sealed," as used herein, refers to a seal which is designed to be non-temporary. This seal is maintained during printing of the image and in the final imaged product, as compared to a temporary package.

In the imaging assembly of the invention, a first support is transparent and a second support is opaque. Consequently, an image is provided against a substantially white background as viewed through the transparent support. Sometimes herein the first support may be referred to as the "front" support and the second support may be referred to as the "back" support.

DETAILED DESCRIPTION OF THE INVENTION

Figure 1:
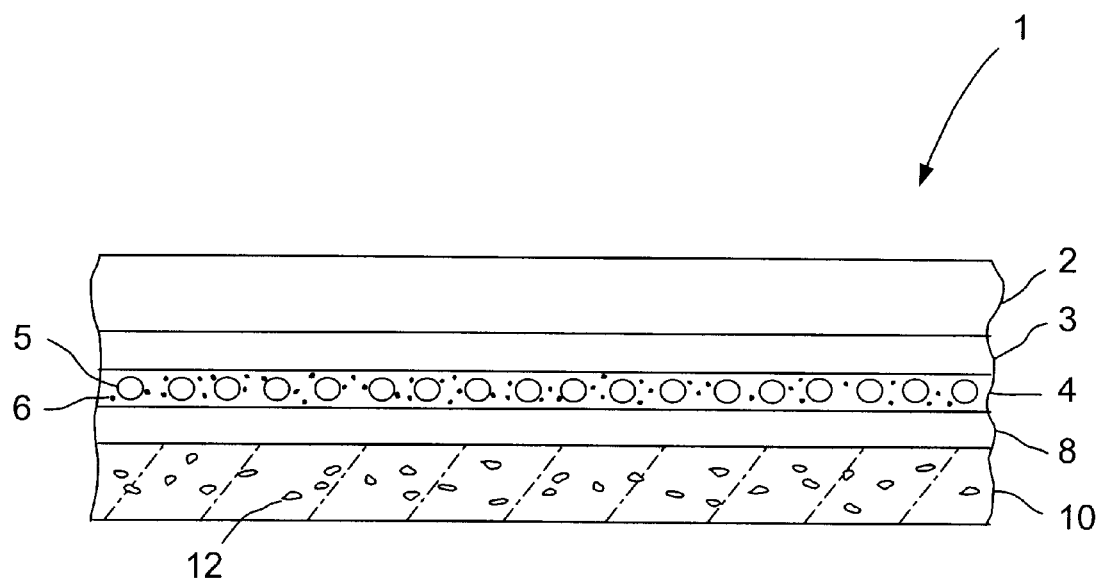
FIG. 1 is a cross-sectional view of a prior-art imaging system.

The present invention is directed to a self-contained imaging assembly for both developing and printing an image, which assembly provides improved image quality by reducing the variation in the sensitometric response of the media caused by changes in the relative humidity of the environment.

By the term "raw stock keeping" (RSK) is meant the stability of the product from time of manufacture to time of use by the customer. Another metric of concern is "media shelf life" which is defined as the stability of the product from the time of opening a presealed package containing the media to the time of consumption (printing) of the media. Typically, a package may contain a plurality of media, for example 20 media.

As mentioned above, the self-contained imaging assembly comprises an imaging layer or series of layers in which a color developing material (also referred to as a color developer) reacts with a dye precursor (also referred to as a color former) inside microcapsules. Typically, the microcapsules encapsulate photohardenable compositions comprising a photosensitive initiator and hardenable material that undergoes a change of mechanical strength when irradiated with light of a predetermined wavelength, wherein the plurality of microcapsules encapsulates at least a dye precursor for coloring when brought into contact with the color developing material.

The plurality of microcapsules comprises three different types of microcapsules. The three types of microcapsules encapsulate the polymerization initiator, photocurable resin (each photocuring by irradiation with light of one of the three primary colors of light, respectively), and the colorless dye precursors for producing each of the colors of yellow, magenta and cyan. For example, when irradiating the self-contained imaging assembly with blue light (with a wavelength of about 470 nm), the photocurable resin of the microcapsules containing only yellow dye precursors is photocured, and these microcapsules (yellow) differentially rupture even when pressure developing the self-contained imaging assembly; however the microcapsules which were not photocured (magenta and cyan) rupture and the magenta and cyan dye precursors are forced out from the microcapsules and react with the color developing material, whereupon coloring occurs, and these colors mix to become a blue color, whereupon this blue color can be seen through the light-transmitting support.

Further, when irradiating the self-contained imaging assembly with green light (with a wavelength of about 525 nm), the photocurable resin of the microcapsules containing only magenta dye precursors is photocured, the yellow and cyan microcapsules are ruptured by pressure development, and as a result of the reaction of the color developing material with the yellow and cyan dye precursors the respective coloring occurs, whereupon these colors mix to become a green color. Moreover, when irradiating the self-contained imaging assembly with red light (with a wavelength of about 650 nm), the photocurable resin of the microcapsules containing only cyan dye precursors is photocured, the yellow and magenta microcapsules are ruptured by pressure development, and as a result of the reaction of the color developing material with the yellow and magenta dye precursors the respective coloring occurs, whereupon these colors mix to become a red color.

Furthermore, when all microcapsules are photocured to maximum hardness by exposure to light corresponding to the three types of microcapsules previously mentioned, they do not rupture even by pressure development. Therefore coloring does not occur, and the surface of the opaque support can be seen through the light-transmitting support, i.e. the surface color (white in the present embodiment) of the opaque support becomes the background color. In short, a color image is formed only in the areas where a coloring reaction occurred when the microcapsules ruptured. This coloring principal is sometimes called "self-coloring."

A prior-art image assembly is illustrated in FIG. 1 which imaging assembly 1 comprises in order: a first transparent support 2, a subbing layer 3, an imaging layer 4 comprising photohardenable microcapsules 5 and a developer material 6, a layer of adhesive 8, and a second support 10 which may or may not contain an opacifying agent 12. By image-wise exposing this unit to actinic radiation, the microcapsules are differentially hardened in the exposed areas and the exposed unit can then be subjected to pressure to rupture the microcapsules.

Figure 2:
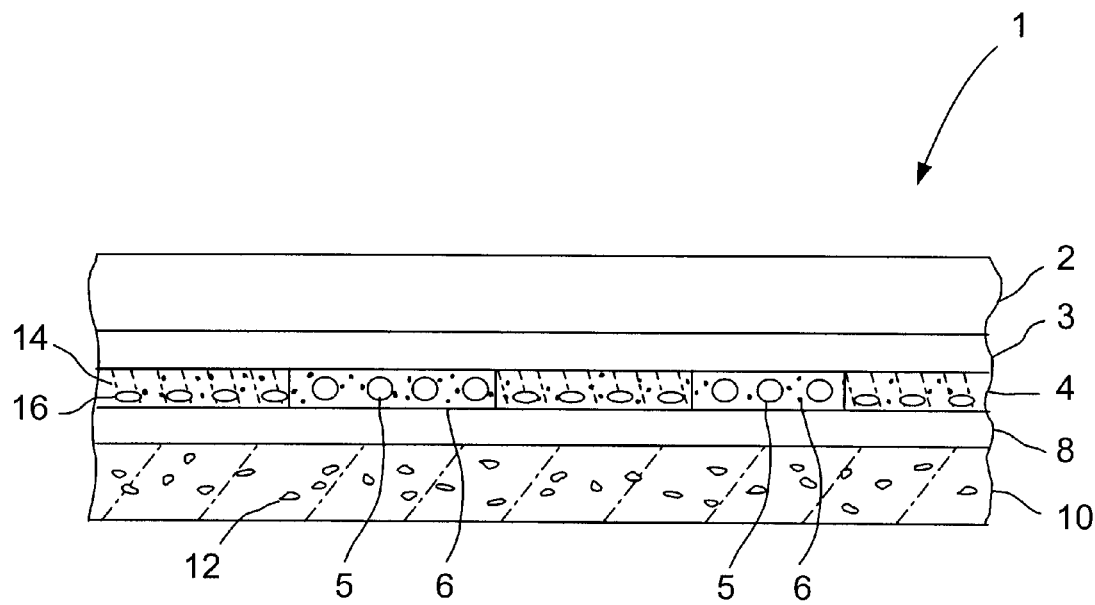
FIG. 2 is a cross-sectional view of the prior-art imaging system of FIG. 1 after exposure and microcapsule rupture.

FIG. 2 illustrates the prior-art imaging assembly of FIG. 1 after exposure and rupture of the microcapsules 5. Ruptured microcapsules 16 release a color forming agent, whereupon the developer material 6 reacts with the color forming agent to form an image 14. The image formed is viewed through the transparent support 2 against the support 10 which can contain a white pigment. Typically, the microcapsules will consist of three sets of microcapsules sensitive respectively to red, green and blue light and containing cyan, magenta and yellow color formers, respectively, as described above and disclosed in U.S. Pat. No. 4,772,54 and U.S. Pat. No. 4,440,846.

Imaging layer 4 typically contains about 20 to 80% (dry weight) developer, about 80 to 20% (dry weight) microcapsules and 0 to 20% of a binder. The layer is typically applied in a dry coat weight of about 8 to 50 g/m². An example of such a coating formulation is illustrated in Example 1 of U.S. Pat. No. 5,916,727.

According to the present invention, the second support of the imaging assembly is opaque and is 10 to 250 microns in thickness, comprises a metallic water vapor barrier layer, which may comprise part of a metallized water vapor barrier sheet, and one or more image-background layers for providing photographic quality whiteness to the formed image. The image-background layers are typically closest to the imaging layer of the imaging assembly in relation to their function of providing whiteness. The entire support provides a light reflectance (at the interface with the overlying imaging layer) of greater than 80%, preferably greater than 90%, most preferably greater than 95%. The water vapor transmission rate (WVTR) of the opaque support of the invention is less than about 0.77 g/m²/day (0.05 gm/100 in²/day) and preferably less than about 0.15 g/m²/day (0.01 g/100 in²/day) at 38° C. and 100% RH. The WVTR is measured according to ASTM Test F1249-90, hereby incorporated by reference.

By the term "support," as used herein, whether referring to the transparent or the opaque support, is meant the material extending from the outside of the assembly to the imaging layer, whether from the bottom or from the top, except not including the adhesive layer that is used to promote adhesion of the support to the adjacent imaging composition. At least the opaque support, as indicated above, comprises at least one water vapor barrier layer and typically is a laminate with other layers that provide opacity, stiffness, and light reflectance.

By the term "barrier layer" or "barrier material" is meant a material that has a water vapor transmission rate of less than 0.77 g/m2/day (0.05 g/100 in²/day) by the ASTM F-1249 test. Since the barrier layer is only a part of the opaque support, the support may have other layers that provide a higher water vapor transmission than the barrier layer, so long as the water vapor transmission rate of the entire opaque support, and preferably both supports, is less than 0.77 g/m2/day (0.05 g/100 in²/day). The opaque support comprising a barrier layer may be referred to as an "opaque barrier support." A separable part of the opaque barrier support containing a barrier layer may be referred to as a "barrier sheet," for example, when referring to a material commercially available for use in the present invention, which sheet is laminated to another sheet or layer during manufacture.

To evaluate the whiteness of the opaque support below the imaging layer, a HUNTER spectrophotometer CIE system D65 procedure can be employed to measure the L Star UVO (ultraviolet filter out). In this test a control sample consisting of a standard color photographic paper can be used to compare the results. L Star UVO values of 92.95, for example, are considered typical. The opacity of the opaque support can also be measured by the HUNTER spectrophotometer CIE system D65. Opacity is a measure of combined light scattering and absorbing power of a specimen. The HUNTER spectrophotometer has a known light source that is transmitted onto the surface of a sample backed by a white reflective tile and a black absorbant tile and indicates the diffuseness or hiding power. A value of 100% would mean that nothing is absorbed and only reflected light is measured. The metallized water vapor barrier sheet employed in the practice of the invention can be a metal foil, a metal coated plastic film, or an aluminum metallized plastic film. The metallic barrier layer can comprise at least one material selected from the group of aluminum, nickel, steel, gold, zinc, copper, titanium, and metallic alloys. The metallic layer can be applied by a variety of known deposition techniques, for example, vacuum deposition including chemical vapor deposition, electron beam evaporation, plasma-type sputtering deposition, ion-assisted deposition such as ion plating, as well as others well known to those skilled in the art of vacuum coating or deposition. The preferred material comprises a vacuum deposited layer of aluminum.

Exemplary metallized water vapor barrier sheets (comprising a metallic layer) are commercially available, for example, Hicor™ 115 MHD, 35MU842, Bicor™70 MET-HB, and 205MET-TWSB (all from Exxon-Mobil Corp.) and metallized 200 gauge Melinex™ 453 polyester film, metallized 142 gauge HOECHST™ polyester film, metallized 92 gauge polyester film, metallized 50 gauge "S" polyester film, and metallized 50 gauge Melinex™ 197 PET (all from CPFilms, Inc.). The metallized water vapor barrier sheet may be a laminate which comprises a combination of two or more metallized films. The water vapor barrier sheet may further comprise one or more pigmented layers to reduce or hide the metallic sheen of the metallized layer.

The one or more image-background layers for providing photographic quality whiteness to the formed image can comprise a microvoided polymer film, a microvoided polymer film laminated on a plastic or a paper substrate, a resin coated paper or a pigmented resin coated plastic film. In a preferred embodiment, the microvoided polymer film is a microvoided polyester or polyolefin film. In a particularly preferred embodiment the microvoided polymer film is a biaxially oriented microvoided polyester or polyolefin film. Preferably the polyolefin is polypropylene and the polyester is poly(ethylene terephthalate). Alternately, the light reflective sheet may comprise, for example, a polyethylene terephthalate sheet containing about 10% titanium dioxide which provides a bright white support. Such a support is commercially available from DuPont Co. under the product designation Melinex™.

In one particular embodiment, a metallized water vapor barrier sheet is laminated to a biaxially oriented polymer film on one side and a paper sheet on the other side. The metallized water vapor barrier can be laminated to the paper base with the use of a melt adhesive or a solvent or aqueous coated adhesive.

The opaque support contains an opacifying agent in the one or more image-background layers which may consist of a laminated sheet or a plurality of laminated sheets in front of the barrier sheet. The opacifying agent employed in the reflective sheet or other layers is an inert, light-reflecting material which exhibits a white opaque background. Materials useful as the opacifying agent include inert, light-scattering white pigments such as titanium dioxide, magnesium carbonate or barium sulfate. In a preferred embodiment the opacifying agent is titanium dioxide.

The opaque support at its face side, i.e., the side of the support that is closest to the imaging composition, has a light reflectance that is preferably greater than 90 percent and more preferably greater than 95%. It has been found that this is advantageous in improving the quality of the image.

In one preferred embodiment of the invention, the opaque second support, 10 to 250 microns thick, has a water vapor transmission rate of less than 0.77 g/m2/day (0.05 g/100 in$^2$/day) and comprises in order starting from the outside of the assembly: a backing layer, an aluminum metallized water vapor barrier sheet; a tie layer, a paper sheet, a tie layer, and a biaxially oriented microvoided polyolefin film or a resin coated pigmented polyolefin film. By the term "tie layer" is meant a relatively thin layer that is used to promote adhesion between thicker layers, films, or sheets. The water vapor barrier sheet is preferably a simple metallized polyester or polyolefin film or a metallized composite film which may include, for example, a vacuum deposited aluminum layer, an adhesion promoting layer, a polyolefin or a microvoided polyolefin film, and a treated surface layer.

As hereinabove described, a biaxially oriented polymeric sheet may be used in the opaque support, either in the image-background layers or in the barrier sheet, as a substrate for a metal coating. Microvoided biaxially oriented composite sheets are preferred and are conveniently manufactured by coextrusion of the core and surface layers, followed by biaxial orientation, whereby voids are formed around void-initiating material contained in the core layer. Such composite sheets are disclosed in, for example, U.S. Pat. Nos. 4,377,616; 4,758,462; and 4,632,869, the disclosures of which are hereby incorporated by reference in their entirety.

The core of the preferred composite sheet should be from 15 to 95% of the total thickness of the sheet, preferably from 30 to 85% of the total thickness. The non-voided skins should thus total from 5 to 85% of the sheet, preferably from 15 to 70% of the thickness. Suitable classes of thermoplastic polymers for the biaxially oriented sheet include polyolefins, polyesters, polyamides, polycarbonates, cellulosic esters, polystyrene, polyvinyl resins, polysulfonamides, polyethers, polyimides, polyvinylidene fluoride, polyurethanes, polyphenylenesulfides, polytetrafluoroethylene, polyacetals, polysulfonates, polyester ionomers, and polyolefin ionomers. Copolymers and/or mixtures of these polymers can be used.

For the biaxially oriented sheet on the face side toward the imaging composition, preferred classes of thermoplastic polymers for the biaxially oriented sheet and the core matrix polymer of the preferred composite sheet comprise polyolefins. Suitable polyolefins include polypropylene, polyethylene, polymethylpentene, polystyrene, polybutylene and mixtures thereof. Polyolefin copolymers, including copolymers of propylene and ethylene such as hexene, butene, and octene are also useful. Polypropylene is preferred, as it is low in cost, has desirable strength properties and is low in water vapor transmission.

The nonvoided skin layers of the composite sheet can be made of the same polymeric materials as for the core matrix. The composite sheet can be made with skin(s) of the same polymeric material as the core matrix, or it can be made with skin(s) of different polymeric composition than the core matrix. For compatibility, an auxiliary layer can be used to promote adhesion of the skin layer to the core.

Addenda may be added to the core matrix and/or to the skins to improve the whiteness of these sheets. This would include any process which is known in the art including adding a white pigment, such as titanium dioxide, barium sulfate, clay, or calcium carbonate. This would also include adding fluorescing agents which absorb energy in the UV region and emit light largely in the blue region, or other additives which would improve the physical properties of the sheet or the manufacturability of the sheet.

Referring now to the top transparent support, it may also, optionally but preferably, contain at least one layer that is a barrier material. This barrier material must have a preselected combination of properties, including thickness (if too thick, too hazy, if too thin not sufficient support) and optical properties. The barrier material must be highly transparent, colorless, practical and cost effective, manufacturable or commercially available, able to be applied via coating or lamination, and stable (non-yellowing). This combination of properties is difficult to find in a single material. Many materials previously used in forming barriers in packaging do not meet all the necessary criteria alone or at all, for example, nylon, PC, PET, polyolefins, and saran polymers. The latter materials do not provide sufficient barrier properties unless using thick layers that are impractical in the present invention. Some materials, while having good moisture barrier properties, have an unacceptable tint, for example silicon oxide coated polyester films. Some materials with exceptional moisture barrier properties are not transparent, for example, aluminum metallized film or paper.

Thus, the assembly may comprise a first transparent support that is 5 to 250 microns in thickness and has a light transmission of at least about 80% at a wavelength of 550 nm and a water vapor transmission rate of less than 0.77 g/m2/day (0.05 g/100 in$^2$/day).

In yet another embodiment of the present invention, a self-contained photohardenable imaging assembly further comprises an intermediate layer comprising a relatively resilient material (compared to first transparent support), wherein the Young's modulus of the resilient material is 0.02 to 10 ksi. This has been found beneficial for better distributing the pressure applied to the microcapsules during development.

Materials which can be used as a barrier sheet for a transparent support include, but are not limited to, fluorinated polymers, ceramic coated polymers, for example aluminum oxide, indium tin oxide, or silicon nitride coated on polyester or other transparent polymeric substrates, and other sheet materials meeting the above limitations. Especially preferred are Al$_2$O$_3$ vacuum deposited coatings on a polyester film (for example, Toppan™ GL-AE, available from Toppan Printing Co.) and chlorotrifluoroethylene homopolymer and copolymer films (for example, ACLAR™ films available from Honeywell Corp.).

It is preferred that a barrier layer is on both sides of the imaging layer in order to maintain the relative humidity within the assembly. It is optional but preferred that the relative humidity within the assembly, and particularly within the at least one imaging layer, is maintained at greater than 40%, preferably greater than 50%, by sealing the front and back supports on the sides, after the imaging layer has equilibrated to the desired relative humidity. When both the top and bottom supports are barrier supports, it is also preferred (but optional) that the peripheral edges of the self-contained assembly are sealed, to prevent water vapor transmission through the side edges, although this is less a concern in view of the small surface area compared to the front and back of the imaging assembly. The edges of the films can be heat sealed together or they can be sealed by any other conventional technique.

Figure 3:
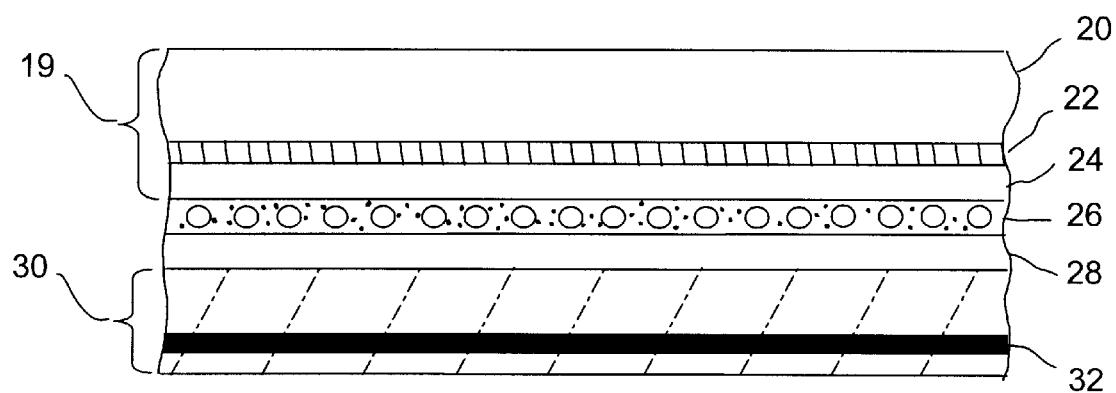
FIG. 3 is a cross-sectional view of an imaging system having an opaque support according to the present invention.

FIG. 3 shows a first embodiment of a laminate structure for an imaging assembly according to the present invention in which the transparent support 19 has a polyester substrate coated with a barrier layer of a ceramic material such as aluminum oxide, indium tin oxide or silicon nitride. In the embodiment of FIG. 3, a polyester substrate 20, which here happens to be 12 microns thick, is coated with an aluminum oxide barrier layer 22. Aluminum oxide is a preferred barrier material for the transparent support. Aluminum oxide is an electrical insulator and is transparent to visible light. It is a strong, hard material and resists attack by most chemicals. The aluminum oxide barrier layer 22 can be deposited on the polymeric film substrate by vacuum deposition including chemical vapor deposition, electron beam evaporation, plasma-type sputtering process, ion assisted process such as ion plating, as well as others well known to those skilled in the art of vacuum coating or deposition. The aluminum oxide barrier layer 22 may be overcoated with a UV absorbing subbing layer 24. The transparent support 19 (including layers 20 through 24) forms the transparent side to the imaging layer 26. On the opaque side is a white support 30 with an aluminum barrier layer 32 attached to the imaging layer 26 by an adhesive layer 28.

Figure 4:
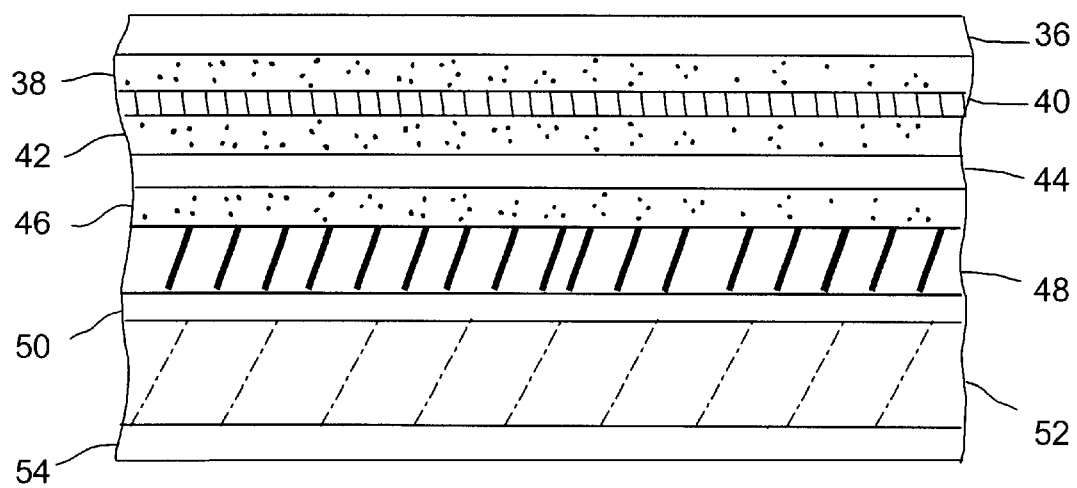
FIG. 4 is an embodiment of an opaque support according to the present invention comprising more layers than the opaque support of FIG. 4.

FIG. 4 shows a cross-sectional view of an opaque support for use in an imaging assembly according to the present invention Starting with the side of the support that is nearest to the imaging composition, the opaque support comprises clear polyolefin layer 36, $TiO_2$ filled polypropylene layer 38, microvoided polypropylene layer 40, $TiO_2$ filled polypropylene layer 42, clear polyolefin layer 44, $TiO_2$ filled polyolefin tie layer 46, paper sheet 48, polyolefin tie layer 50, aluminum metallized barrier sheet 52, and backing layer 54.

Adhesive materials useful for adhering the second support to the emulsion or imaging layer can be selected from the general class of "modified acrylics" that have good adhesion, which may be formulated with improved "tack" by addition of tackifying resins or other chemical additives. A useful adhesive must be designed for high initial adhesion and for adhesion to plastic substrates like polyester. It must have the ability to flow quickly for laminating to porous material (the imaging layer) and yet be inert with respect to the imaging layer. High strength adhesives useful in this invention, for example, are the film label stock adhesives of the 3M Company; including 3M's #300 and #310 adhesive formulas which exhibit "inertness" to the imaging layer. Other examples of adhesives useful in this invention are aqueous-based adhesives such as Aeroset™ 2177 or Aeroset™t 2550, 3240, and 3250 which are commercially available from Ashland Chemical Co., PD 0681, AP 6903, and W 3320 available from H. B. Fuller, or solvent-based pressure sensitive adhesives such as PS 508 sold by Ashland Chemical Co. The adhesives may be used separately or in combination. Preferably, the adhesive is transparent or translucent and most preferably it is a transparent adhesive which remains transparent even after subjecting the assembly to actinic radiation and pressure necessary to image-wise expose and rupture the microcapsules. The amount of the adhesive will vary depending on the nature of the adhesive and the support. The adhesive is generally applied in an amount of about 0.5 to 20 $g/m^2$.

A subbing layer for promoting adhesion between the transparent support and the imaging layer must have good compatibility with the imaging layer, must be transparent, must not effect the sensitometric response of the imaging layer, and must be chemically stable. Amorphous polyesters, which may be applied as an aqueous dispersion, have been found to work well as the subbing layer material. Polymers with molecular weights of 5,000–15,000, with a low hydroxyl number and low acid number, can be employed, for example, the AQ polymers from Eastman Chemical Co. and, more particularly, AQ38 and AQ55. The subbing layer is coated onto the transparent support at a dried coating weight of from about 0.1 to about 5.0 $g/m^2$, with a preferred dried coating weight of from about 0.5 to 2.0 $g/m^2$.

Preferably the subbing layer also includes an ultraviolet (UV) ray absorber. Many types of UV absorbing materials have been described in the prior art, including U.S. Pat. Nos. 3,215,530, 3,707,375, 3,705,805, 3,352,681, 3,278,448, 3,253,921, 3,738,837, 4,045,229, 4,790,959, 4,853,471, 4,865,957, and 4,752,298, 5,977,219, 5,538,840 and United Kingdom Pat. 1,338,265. Most preferred UV absorbers are polymeric UV absorbers prepared by the method described in U.S. Pat. Nos. 4,496,650, 4,431,726, 4,464,462 and 4,645,735, 5,620,838, EP 0 190 003, U.S. Pat. Nos. 3,761,272, 3,813,255, 4,431,726, 4,455,368, and 4,645,735.

Suitable photohardenable compositions, photoinitiators, chromogenic materials, carrier oils and encapsulation techniques for the layer of microcapsules are disclosed in U.S. Pat. No. 4,440,846, 4,772,541; and 5,230,982. Although the latter photohardenable compositions are non-silver systems, silver-based photohardenable microencapsulated system such as that described in U.S. Pat. Nos. 4,912,011; 5,091,280 and 5,118,590 and other patents assigned to Fuji Photo Film Co are also suitable for use in the present invention.

In accordance with the preferred embodiments of the invention, a full color imaging system is provided in which the microcapsules are sensitive to red, green, and blue light, respectively. The photohardenable composition in at least one and preferably all three sets of microcapsules may be sensitized by a cationic dye-borate anion complex, e.g., a cyanine dye/borate complex as described in U.S. Pat. No. 4,772,541. For optimum color balance, the microcapsules are sensitive (lambda max) at about 450 nm, 540 nm, and 650 mn, respectively. Such a system is useful with visible light sources in direct transmission or reflection imaging. Such a material is useful in making contact prints or projected prints of color photographic slides. They are also useful in electronic imaging using lasers, light emitting diodes, liquid crystal displays or pencil light sources of appropriate wavelengths.

Because cationic dye-borate anion complexes absorb at wavelengths greater than 400 nm, they are colored. The unreacted dye complex present in the microcapsules in the low density image areas can cause undesired coloration in the background area of the final picture, for example, the mixture of microcapsules tends to be green which may give the low density image areas a slight greenish tint. Approaches to reducing undesired coloration in the low density image area as well as the developed image include reducing the amount of photoinitiator used, adjusting the relative amounts of cyan, magenta and yellow microcapsules, or providing a compensating tint in the white opaque support.

The photohardenable compositions used in the microcapsules may also contain a disulfide coinitiator. Examples of useful disulfides are described in U.S. Pat. No. 5,230,982. By means of the optional use of such disulfides, the amount of the photoinitiators used in the microcapsules can be reduced to levels such that the background coloration or residual stain is less than 0.3 and preferably less than 0.25 density units.

The photohardenable compositions of the present invention can be encapsulated in various wall formers using conventional techniques, including coacervation, interfacial polymerization, polymerization of one or more monomers in an oil, as well as various melting, dispersing, and cooling methods. To achieve maximum sensitivities, it is important that an encapsulation technique be used that provides high quality capsules which are responsive to changes in the internal phase viscosity in terms of their ability to rupture. Because the borate tends to be acid sensitive, encapsulation procedures conducted at higher pH (e.g., greater than about 6) are preferred. Melamine-formaldehyde capsules are particularly useful. U.S. Pat. No. 4,962,010 discloses a conventional encapsulation useful in the present invention in which the microcapsules are formed in the presence of pectin and sulfonated polystyrene as system modifiers. A capsule size should be selected which minimizes light attenuation. The mean diameter of the capsules used in this invention typically ranges from approximately 1 to 25 microns. As a general rule, image resolution improves as the capsule size decreases. Technically, however, the capsules can range in size from one or more microns up to the point where they become visible to the human eye.

The developer materials employed in carbonless paper technology are useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts of aromatic carboxylic acids or derivatives thereof such as zinc salicylate, tin salicylate, zinc 2-hydroxy napththoate, zinc 3,5 di-tert butyl salicylate, zinc 3,5-di-(a-methylbenzyl) salicylate, oil soluble metals salts or phenol-formaldehyde novolak resins (e.g., see U.S. Pat. Nos. 3,672,935 and 3,732,120) such as zinc modified oil soluble phenol-formaldehyde resin as disclosed in U.S. Pat. No. 3,732,120, zinc carbonate etc. and mixtures thereof. The particle size of the developer material can affect the quality of the image. In one embodiment, the developer particles are selected to be in the range of about 0.2 to 3 microns, preferably in the range of about 0.5 to 1.5 microns. One or more suitable binders selected from polyethylene oxide, polyvinyl alcohol, polyacrylamide, acrylic latices, neoprene emulsions, polystyrene emulsions, and nitrile emulsions, etc. may be mixed with the developer and the microcapsules, typically in an amount of bout 1 to 8% by weight, to prepare a coating composition. A preferred developer material is one which provides good compatibility with the microcapsule slurry solution, for example Schenectady International resin HRJ-4250 solution.

The self-contained imaging assembly used as photosensitive recording medium is not limited to the embodiments that have been described before, but different variations or modifications thereof are possible. For example, instead of encapsulating the photocurable resin and the polymerization initiator inside the microcapsules of the self-contained imaging assembly, the photocurable resin and the polymerization initiator can also be included in the material constituting the microcapsules. Further, instead of photocurable microcapsules, the self-contained imaging assembly can contain photo-softening microcapsules, for example, microcapsules which have sufficient strength in the unexposed state, and which soften when exposed to light of a predetermined wavelength. In this case it is desirable to perform thermal-curing by heat-fixing.

There is no need to use red, green and blue light to capture the image in the imaging layer; depending on the characteristics of the photosensitive recording medium, light with various wavelengths can be selected. For example, light emitting elements producing infrared light, red, and green, or light emitting elements producing far infrared light, near infrared light, and red can also be selected. Ultraviolet and far ultraviolet are also advantageous examples of valid color choices for light emitting elements. Moreover, the number of colors of the light emitting elements is not limited to the three colors red, green, and blue; it is equally possible to use only one or two colors, or to select four colors, as in a typical color printer using yellow, magenta, cyan, and black, or even more colors. Furthermore, the choice of light emitting elements includes, but is not limited to LEDs, electroluminescent lamps (EL), light emitting plasma and laser devices, and other light emitting elements.

The manufacture of an assembly according to the present invention is exemplified as follows. A clear support is sub-manufactured by lamination of three separate materials, a ceramic-coated first laminated layer, a polyester layer, and a second ceramic-coated second laminated layer. These three materials are formed into a clear support with the addition of a UV absorbing subbing layer. At the same time an opaque support is sub-manufactured by lamination of three separate materials, a polyolefinic material, paper stock, and aluminum coated barrier sheet. These three materials are formed into an opaque support with the addition of a backing/matte sheet.

An emulsion or image layer is then applied to the clear support to form the first of two final components of the assembly, an emulsion-containing component which is then combined with the opaque support to form a final laminate which can be preconditioned to a certain relative humidity. The final laminate may then be cut and edge sealed, followed by packaging and bar coding.

In order to insure that the imaging system is effectively sealed between the supports, a subbing layer is provided to attach the transparent supports to the imaging layer and an adhesive is provided between the back support and the imaging layer. For optical clarity, the subbing layer will typically be located between the first support and the imaging layer. However, which support receives the subbing layer and which support receives the adhesive is a function of which support is coated with the wet imaging layer composition and which is assembled with the coated and dried imaging layer. The support which is coated with the imaging layer composition (which is typically the front support) will be provided with the subbing layer and the support which is assembled will receive the adhesive. In accordance with the preferred embodiment of the invention, the subbing layer is formed from a compound having chemical moieties such as hydroxy groups which will react with and bind to the microcapsules.

The imaging assembly of the present invention can be exposed in any suitable camera or other exposure device to provide an image. The imaging assembly of this invention is especially suitable for exposure using a liquid crystal array or light emitting diodes driven by a computer generated signal or a video signal for the reproduction of images from a video cassette recorder, a camcorder, or the like. It is possible to utilize, for example, with the current state of technology, a very economical compact printer, weighing under 500 g and having a size less than 100,000 $mm^3$ that prints directly from a digital camera utilizing a Compact-Flash™ card interface and provides a resolution of 150 ppi or more with continuous tone and over 250 gradation levels.

The print is "developed," based on the "latent image" formed by the selectively photohardened microencapsulated color formers, by the application of pressure or by the application of both heat and pressure. See, for example, the image forming device described in U.S. Pat. No. 5,884,114 to Iwasaki, in which a photo and pressure sensitive printer provides the feeding and discharging of a photosensitive imaging medium at the front of the printer housing, which device can have the added advantage of being easily integrated into other equipment such as a personal computer. In this particular device, the latent image is formed by a movement in the main scanning direction of an LED-type exposure head. Thereafter, an upper nip roller of a developing mechanism is moved from a separated position to a pressing position. The capsules that have not been photo-hardened are ruptured by pressure and a full color image is formed on the sheet, heat-fixing (which is optional to the present invention) is performed by a film heater, and the imaged assembly is discharged from the front of the housing for the device or printer.

A typical pressure-type image-forming device (which can be referred to as a printer) typically comprises a printer housing with a lightproof cartridge for accommodating photosensitive imaging media (alternately referred to as recording media) mounted to the front of the printer housing so as to be easily detachable. In some devices, a preheater is employed for preheating the photosensitive imaging medium. A typical exposure mechanism may include an exposure head for exposing while scanning in a direction perpendicular to the surface of the drawing and a developing mechanism for pressure development by means of a pair of an upper and a lower nip roller. The roller may be maintained under pressure by a spring. An optional fixing heater for heat-fixing the developed photosensitive imaging medium may be used. A discharge tray may be provided at the rear end of the printer housing. The pressure sensitive printer may be designed so that sheets are both fed and discharged at the front side of the printer housing.

An image forming device for treatment of the imaging media can, for example, comprise exposure means for forming a latent image on the imaging medium upon exposure based on image information, developing means for developing the latent image by means of the coloring material coming out of the microcapsules when pressure is applied to the photosensitive imaging medium on which the latent image was formed by the exposure means, wherein the developing means comprise a pair of an upper and a lower nip roller facing each other and sandwiching the transport path of the photosensitive imaging medium, pressing means for pressing one nip roller against the other nip roller, roller switching means for alternately switching between a pressing position in which the one nip roller is brought into pressure contact with the other nip roller and a separated position in which the one nip roller is separated from the other nip roller, and a transport path for transporting the photosensitive imaging medium comprises a feed path for feeding the photosensitive imaging medium on the inlet side, a discharge path for discharging the recorded photosensitive imaging medium.

In one embodiment, the developing mechanism may comprise a pair of an upper and a lower nip roller, a rectangular frame fixed inside the printer housing for supporting the nip rollers, a pair of compression springs for pressing both ends of the roller axis of the upper nip roller toward the lower nip roller, and a roller switching mechanism for alternately switching between a pressing position in which the upper nip roller is brought into pressure contact with the lower nip roller and a separated position in which it is separated from the lower nip roller. If the pressing force of each of the springs is 150 kgf, the upper nip roller presses with a total force of 300 kgf on the lower nip roller. However, other means for applying pressure can be employed, for example, a pressure stylus.

A control unit for the image-forming device may comprise a CPU, a ROM and a RAM, an I/O interface, and drive circuits, wherein a stepping motor for paper transport, a solenoid actuator for driving a switching plate, a film heater, a motor for roller switching, a stepping motor for driving the carriage, the exposure head, etc., are respectively connected to the drive circuits. A connector and a control panel may also be connected to the control unit. In one embodiment, image data (RGB image data) from an external host computer may be fed via a connector to the control unit.

The ROM can store control programs for controlling all operations of the printer, a control program for calculating, from the input image data, the duration for which each LED of the exposure head is turned on and the timing thereof, a control program for controlling the transport of the self-contained imaging assembly by controlling the stepping motor for sheet transport synchronously with the exposure to green, red and blue light, a control program for controlling the scanning of the exposure head by controlling the stepping motor for driving the carriage synchronously with the exposure to green, red and blue light, etc. The different buffers and memory types necessary for running the control programs are in the RAM. The number of copies to be printed, the enlargement or reduction ratio of the image, the size of the image forming area of the imaging assembly, etc., input by an operator at the control panel, can be stored in the memory of the RAM. Exposure can take place upon calculation of the driving conditions for the stepping motor.

In one type of image-forming device, when image data of an image is sent to the control unit, the image data is divided into R image data, G image data, and B image data and stored in a buffer of the RAM. Each LED of an exposure heat can be electrically driven by a drive circuit via a cable.

In one embodiment of practicing the invention, imaging medium sheets may be packaged as a stack of sheets which go into the printer. The individual sheets may be picked from the stack of sheets and transported into the "printing path" of the printer. However, if two or more sheets at the same time are picked up and fed into the printing path the printer, the printer may become jammed, requiring disassembly by the user. To avoid this problem, the static in the sheets may be reduced or eliminated just prior to the final packaging; and a precision hinge on the printer film cassette or tray may be used. Also, a method to further aid the feeding of sheets into the printer is to add a "back coat" or backing layer to the imaging medium. This is preferably coated on the outer surface of the bottom or second support (which has the adhesive on the opposite side), typically the white support layer. This backing layer material may be formulated to have some perceived aesthetic value (such as a writable or printable coating), but must have some difference relative to the adjacent next sheet surface which causes these surfaces not to adhere together. The preferred backing layer material has a slight roughness to aid the "printer pickup roller" initiating the sheet movement into the printer, for example, a Sheffield Smoothness of 150–180 Sheffield units, such as a standard face matte coating on 3M label stock material. Other commercially available or known matte coatings can also be used. In general, these coatings may include a binder and a grit or abrasive such as silica. Preferably, the front side of the first support and the back side of the second support has a coefficient of friction of less than 0.4. For example, the backing layer can comprise a polyurethane (Zeneca Resins Neorez R9621® aqueous dispersed polyurethane) and a mixture of poly(divinyl benzene) matte beads having a diameter of 6 and 14 microns. A wide variety of binders could be used effectively in the backing layer including polyurethanes, polyesters, polymers containing ethylenically unsaturated monomers including styrene and its derivatives, (meth)acrylic acid and their derivatives, divinyl benzene, (meth)acrylamide polymers, hydrophilic colloids including gelatin, cellulose esters, etc.

The present invention is illustrated in more detail by the following non-limiting example.

EXAMPLE 1

The following opaque supports for use in the present invention were prepared by extrusion laminating a biaxially oriented opaque sheet to the face side of a photographic grade cellullose paper and an aluminum metallized composite film to the back side of the paper.

Face side of Opaque Support

A biaxially oriented multi-layer sheet of polypropylene having a total thickness of 30 microns and containing in order, a polyethylene skin layer, a $TiO_2$ containing layer having approximately 15% $TiO_2$, a cavitated polypropylene core, and a layer of clear polypropylene, was extrusion laminated to a 75 micron thick photographic grade cellulose raw stock paper using a tie layer of low density polyethylene with a density of 0.923 g/cm$^3$ and a melt index of 4.2 at 12 g/m$^2$ to adhere the oriented sheet to the paper base.

Back side of Opaque Support

The following metallized composite films were laminated to the back side of the 75 micron thick photographic grade cellulose raw stock paper using a tie layer of ethylene-methyl acrylate copolymer resin having a density of 0.94 g/cm$^3$ and a melt index of 2.0 at 12 g/m$^2$ in order to prepare opaque laminated supports of the invention. The metallized side of the composite films was laminated facing the paper base.

Opaque Support A was a 205MET TWSB™ composite film from Exxon-Mobil Corporation having a thickness of about 50 micron and having an aluminum metallized layer on one side of the composite film, a treated clear layer on the other side, and a cavitated white core layer. A thin adhesion promoting layer was present between the vacuum deposited aluminum metallized layer and the core layer. The opaque support A thus formed had a total thickness of about 175 microns and a water vapor transmission rate of about 0.047 g/m$^2$/day (0.003 g/100 in$^2$/day) as measured according to the procedures set forth in ASTM F1249 at 38° C. and 100% relative humidity.

Opaque Support B was a Bicor 70 MET-HB™ from Exxon-Mobil Corporation having a thickness of about 17.5 microns and having an aluminum metallized layer on one side of the composite film, a sealant layer on the other side, a high energy treated layer interfacing with the metallized aluminum layer and a polypropylene core layer. To reduce the metallic color, the support was further laminated on the surface of the sealant layer with 350 TWL K18™ from Exxon-Mobil Corporation which has a thickness of about 35 microns and consisted of a cavitated core layer and two layers each containing about 18% $TiO_2$ by weight using a tie layer of a ethylene-methyl acrylate copolymer resin. The opaque support B thus formed has a total thickness of about 182.5 microns and a water vapor transmission rate of about 0.063 g/m$^2$/day (0.004 g/100 in$^2$/day) as measured according to the procedures set forth in ASTM F1249 at 38° C. and 100% relative humidity.

Opaque Support C was 35MU842™ from Exxon-Mobil Corporation having a thickness of about 35 microns and having an aluminum metallized layer on one side of the composite film, a treated clear layer on the other side, and a cavitated white core layer. A thin adhesion promoting layer was present between the vacuum deposited aluminum metallized layer and the core layer. The opaque support C thus formed had a thickness of about 167.5 microns and a water vapor transmission rate of about 0.063 to 0.154 g/m$^2$/day (0.004 to 0.01 g/100 in$^2$/day) as measured according to the procedures set forth in ASTM F1249 at 38° C. and 100% relative humidity.

EXAMPLE 2

This example illustrates the effect of a moisture barrier such as the opaque supports described in Example 1 on the sensitometric response of an imaging assembly containing photohardenable microcapsules. Imaging media containing photohardenable microcapsules in an imaging layer, commercially available from Cycolor, Inc, were obtained packaged in a plastic cartridge. The media in the cartridge were preconditioned at 80% relative humidity/70° F. for 3 days. Prints were then made with some of these preconditioned media using a Vivitar VPP-150™ Photo Printer. These prints provided the sensitometric response for fresh media. The remaining preconditioned media were then removed from the cartridge and separated in a darkroom into two groups, Group I and Group II. Individual samples of media in group I were packaged in separate bags made of a barrier material having a water vapor transmission rate of about 0.47 g/m$^2$/day (0.03 g/100 in$^2$/day) in a darkroom at 80% relative humidity. The bag was made to essentially the same dimensions (length times width) as the media and was sealed on the edges by heat. The media in Group II were used as the control. Both groups of media were then kept in a darkroom at 40% relative humidity/70° F. and prints were made with a Vivitar VPP-150™ Photo Printer at given time intervals, 0, 2, 4, 7, 14, 28, 35, 42 and 49 days, to determine the effect of the lower humidity on sensitometric response for the two groups of media. The Group I media were removed from the sealed bag just prior to printing. The Group I media were removed from the sealed bag and loaded into an empty cartridge just prior to printing. The respective optical densities (Dmin) of prints from both groups were measured using an X-Rite 820TR™ Densitometer in order to obtain Dmin values for the cyan dye, magenta dye, and yellow dye, respectively. The results thereof are shown in FIGS. 8 to 10.

Figure 5:
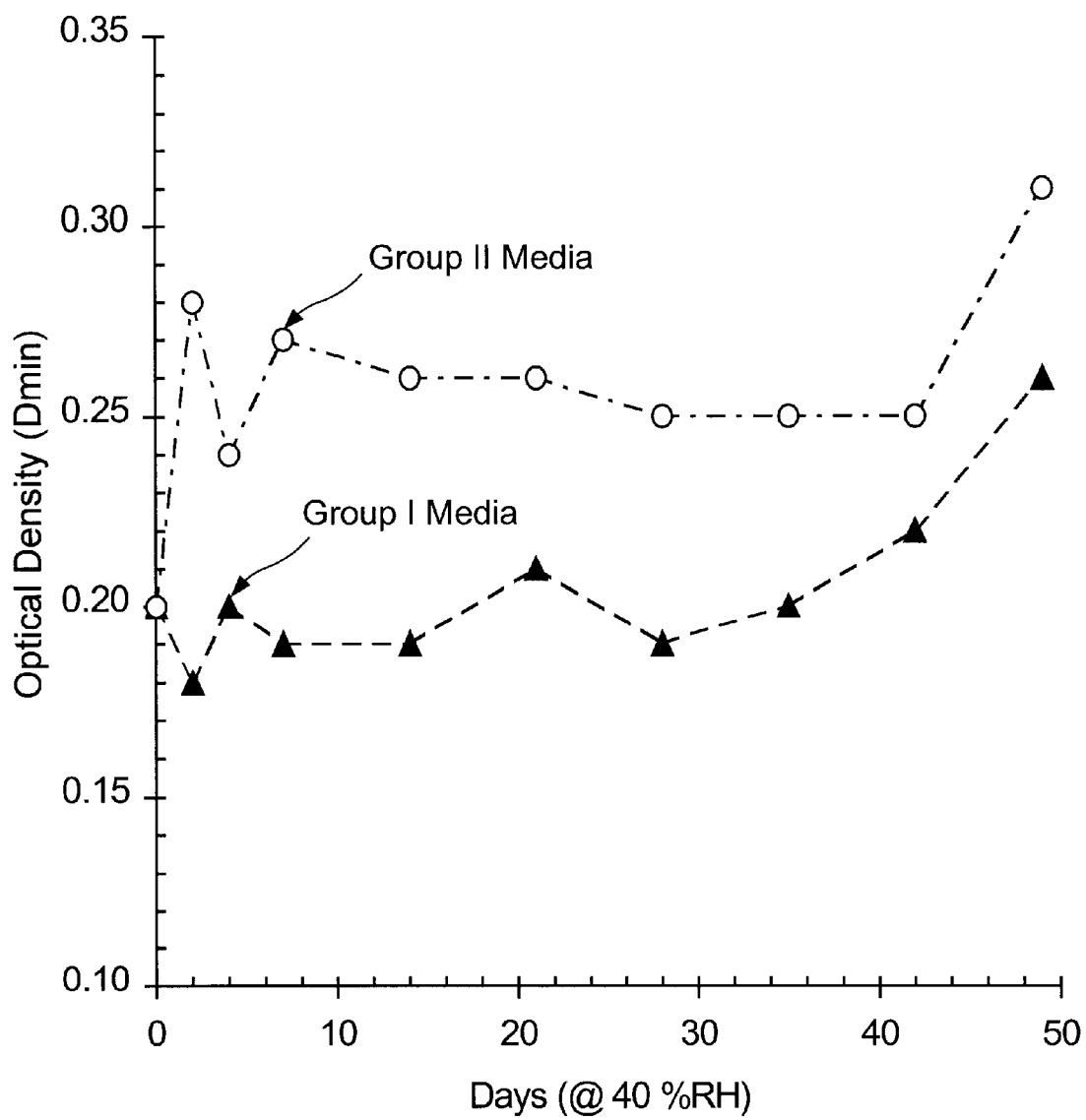
FIG. 5 shows, based on the results of Example 1 below, the Dmin change for a barrier treated media for use in the present invention, at 40% relative humidity and 70° F. as a function of time, for a yellow dye.

FIG. 5 shows the Dmin for the yellow dye for prints made from media from Group I and Group II (control) that were exposed to 40% relative humidity for various times.

Figure 6:
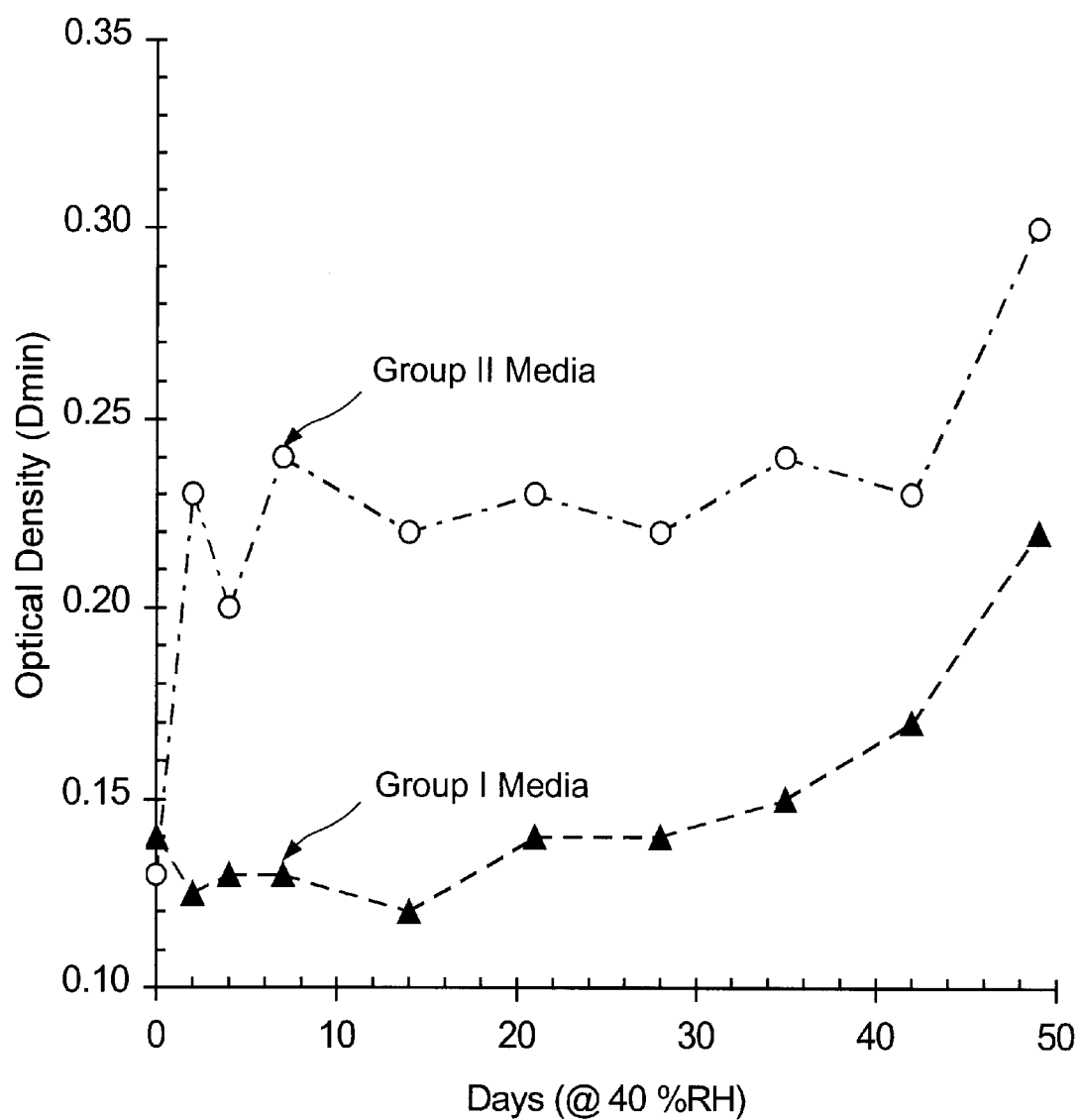
FIG. 6 shows, based on the results of Example 1 below, the Dmin change for a barrier treated media for use in the present invention, at 40% relative humidity at 70° F. as a function of time, for a magenta dye.

FIG. 6 shows the Dmin for the magenta dye for prints made from media from Group I and Group II (control) that were exposed to 40% relative humidity for various times.

Figure 7:
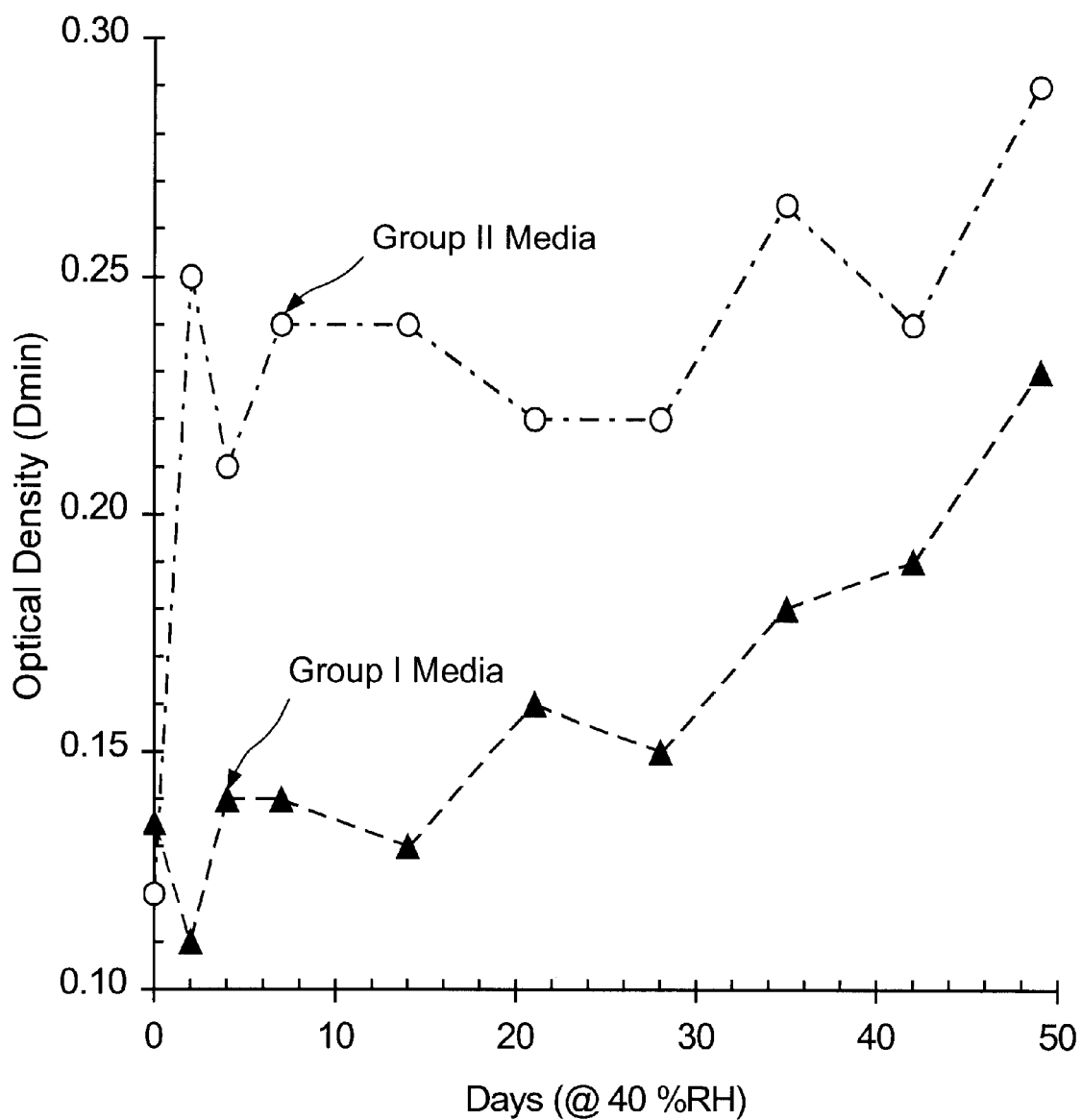
FIG. 7 shows, based on the results of Example 1, below the Dmin change for a barrier treated media for use in the present invention, at 40% relative humidity/70° F. as a function of time, for a cyan dye.

FIG. 7 shows the Dmin for the cyan dye for prints made from media from Group I and Group II (control) that were exposed to 40% relative humidity for various times.

These experiments show that the Dmin for the control (Group II media) increased significantly after only 2 days. On the other hand, the Group I media that had a moisture barrier showed no change in Dmin after exposure to 40% relative humidity for as much as 35 days. The results of this study demonstrate that laminating the media with a barrier material according to the present invention would minimize variations in sensitometric response of the imaging assembly due to changes in humidity.

Having described the invention in detail and by reference to preferred embodiments thereof it will be apparent that modifications and variations are possible without departing from the scope of the invention defined in the appended claims.

What is claimed is:

1. A self-contained photohardenable imaging assembly comprising in order from front to back the following:
   a transparent first support that is 10 to 250 microns in thickness and has a light transmission of at least about 80% at a wavelength at 550 nm;
   at least one imaging layer comprising a plurality of photohardenable microcapsules encapsulating a color precursor which can react with a developer material in the same or an adjacent imaging layer;
   an opaque second support that is 10 to 250 microns thick and has a water vapor transmission rate of less than 0.77 g/m2/day (0.05 g/100 in$^2$/day) and a light reflectance of greater than 80%, said second support comprising, also in order, one or more image-background layers comprising an effective amount of a white pigment for producing photographic quality whiteness in front of a metallic barrier layer.

2. The imaging assembly of claim 1, wherein the metallic barrier layer comprises a metal foil.

3. The imaging assembly of claim 1, wherein the metallic barrier layer is coated on a plastic film.

4. The imaging assembly of claim 1, wherein the image-background layers comprise a microvoided polymer layer.

5. The imaging assembly of claim 1, wherein the image-background layers comprise a polyolefinic sheet overlying cellulosic paper or microvoided or non-microvoided polyester.

6. The imaging assembly of claim 4, wherein the microvoided polymer layer is a microvoided polyester.

7. The imaging assembly of claim 4, wherein the microvoided polymer layer is a biaxially oriented microvoided polyolefin.

8. The imaging assembly of claim 1, wherein the metallic barrier layer comprises aluminum metal.

9. The imaging assembly of claim 7, wherein the polyolefin is polypropylene.

10. The imaging assembly of claim 1, wherein the metallic barrier layer comprises part of a sheet that is laminated or coated with a pigmented layer to substantially reduce the metallic color of the metallic barrier layer when viewing the imaging assembly from the back.

11. The imaging assembly of claim 1, wherein the barrier sheet has an WVTR value of less than 0.77 g/m2/day (0.05 g/100 in$^2$/day) per 25 micron of thickness.

12. The imaging assembly of claim 1, wherein an adhesive layer is disposed between said second support and said at least one imaging layer.

13. The imaging assembly of claim 1, wherein the front side of the transparent support and the back side of the opaque support has a coefficient of friction of less than 0.4.

14. The imaging assembly of claim 1, wherein the imaging assembly is sealed between the transparent support and the opaque support.

15. The imaging assembly of claim 1, wherein said transparent support comprises a barrier layer selected from the group consisting of fluorinated polymers, inorganic oxides, and inorganic nitrides.

16. The imaging assembly of claim 1, wherein said pigment is titanium dioxide.

17. The imaging assembly of claim 1, wherein said microcapsules are melamine-formaldehyde microcapsules and said developer is a phenolic resin.

18. A sealed self-contained photohardenable imaging assembly comprising in order from front to back:
   a first transparent support that is 10 to 250 microns in thickness and has a light transmission of at least about 80% at a wavelength of 450 to 800 nm and a water vapor transmission rate of less than 0.77 g/m$^2$/day (0.05 g/100 in$^2$/day);
   one or more imaging layers comprising a plurality of photohardenable microcapsules encapsulating a color precursor which can react with a developer material in the same or an adjacent imaging layer;
   a second support which is opaque, 10 to 250 microns thick, having a water vapor transmission rate of less than 0.77 g/m$^2$/day (0.05 g/100 in$^2$/day), said second support comprising in order starting from the outside of the assembly:
      a metallic barrier layer;
      one or more image-background layers comprising a polyolefin sheet overlying a paper and/or polyester material having a thickness of 10 to 250 microns and an effective amount of a white pigment for producing photographic quality whiteness in front of the metallic barrier layer;
      wherein the opaque support has a reflection value of greater than 90% at its front side.

19. The imaging assembly of claim 18, wherein the image-background layers comprises a biaxially oriented microvoided polyolefin.

20. The imaging assembly of claim 19, wherein said biaxially oriented sheet microvoided polyolefin comprises polypropylene.

21. The imaging assembly of claim 18, wherein the metallic barrier layer is laminated or coated with a pigmented layer to reduce the metallic color of the barrier layer when viewed from the outside of the imaging assembly.

22. The imaging assembly of claim 18, wherein the front of the image-background layers have a light reflectance of greater than 95%.

23. The imaging assembly of claim 18, wherein the metallic barrier layer has WVTR value of less than 0.77 g/m2/day (0.05 g/100 in$^2$/day) per 25 micron of thickness.

24. The imaging assembly of claim 18, wherein said image-background layers comprise, from front to back, a polyolefinic layer and a cellulose fiber paper layer.

25. A self-contained photohardenable imaging assembly comprising in order from front to back the following:
   a transparent first support that is 10 to 250 microns in thickness and has a light transmission of at least about 80% at a wavelength at 550 nm, which transparent support comprises a barrier layer selected from the group consisting of fluorinated polymers, inorganic oxides, and inorganic nitrides;
   at least one imaging layer comprising a plurality of photohardenable microcapsules encapsulating a color precursor which can react with a developer material in the same or an adjacent imaging layer;
   an opaque second support that is 10 to 250 microns thick and has a water vapor transmission rate of less than 0.77 g/m2/day (0.05 g/100 in$^2$/day) and a light reflectance of greater than 80%, said second support comprising, also in order, one or more image-background layers comprising an effective amount of a white pigment for producing photographic quality whiteness in front of a metallic barrier layer.

* * * * *